(12) United States Patent
Chang et al.

(10) Patent No.: US 11,967,966 B2
(45) Date of Patent: Apr. 23, 2024

(54) CIRCUIT AND METHOD FOR EXPANDING LOCK RANGE OF INJECTION-LOCKED OSCILLATORS

(71) Applicant: ZHEJIANG UNIVERSITY, Zhejiang (CN)

(72) Inventors: Ziyi Chang, Zhejiang (CN); Bo Zhao, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 18/076,359

(22) Filed: Dec. 6, 2022

(65) Prior Publication Data

US 2023/0117853 A1 Apr. 20, 2023

Related U.S. Application Data

(63) Continuation of application No. PCT/CN2022/083900, filed on Mar. 30, 2022.

(30) Foreign Application Priority Data

Oct. 14, 2021 (CN) .......................... 202111197412.5

(51) Int. Cl.
*H03L 7/24* (2006.01)
*H03L 7/095* (2006.01)
*H03L 7/099* (2006.01)

(52) U.S. Cl.
CPC ............. *H03L 7/24* (2013.01); *H03L 7/095* (2013.01); *H03L 7/0995* (2013.01)

(58) Field of Classification Search
CPC ....................................................... H03L 7/24
See application file for complete search history.

(56) References Cited

U.S. PATENT DOCUMENTS

2014/0035650 A1* 2/2014 Zerbe .................... H03L 7/0995
327/299
2014/0241442 A1 8/2014 Ahmadi et al.
(Continued)

FOREIGN PATENT DOCUMENTS

CN 102332915 1/2012
CN 104202042 12/2014
(Continued)

OTHER PUBLICATIONS

"International Search Report (Form PCT/ISA/210) of PCT/CN2022/083900," dated Jun. 24, 2022, pp. 1-4.
(Continued)

*Primary Examiner* — Patrick O Neill
(74) *Attorney, Agent, or Firm* — JCIPRNET

(57) ABSTRACT

The present disclosure provides a circuit and method for expanding the lock range of injection-locked oscillators. The circuit includes N injection-locked oscillators and a lock detector, where the lock detector includes an alignment monitor, a clock selector, and N self-samplers. A pulse reference signal is inputted into the N injection-locked oscillators, and the output of each injection-locked oscillator is connected to the clock selector and the corresponding self-sampler. The self-samplers sample the outputs of the N injection-locked oscillators and output the sampling results to the alignment monitor. The alignment monitor monitors the sampling results, determines the locking conditions of the injection-locked oscillators, and turns off the unlocked oscillators. The clock selector selects a locked oscillator and transmits the output of the locked oscillator as a system lock.

7 Claims, 1 Drawing Sheet

(56) References Cited

U.S. PATENT DOCUMENTS

2018/0351563 A1* 12/2018 Allott .................... H03L 7/0802
2020/0119742 A1* 4/2020 Jain .......................... H03L 7/22

FOREIGN PATENT DOCUMENTS

| CN | 110635801 | 12/2019 |
| CN | 114124086 | 3/2022 |

OTHER PUBLICATIONS

"Written Opinion of the International Searching Authority (Form PCT/ISA/237) of PCT/CN2022/083900," dated Jun. 24, 2022, pp. 1-5.

* cited by examiner

CIRCUIT AND METHOD FOR EXPANDING LOCK RANGE OF INJECTION-LOCKED OSCILLATORS

CROSS-REFERENCE TO RELATED APPLICATION

This application is a continuation of international application of PCT application serial no. PCT/CN2022/083900 filed on Mar. 30, 2022, which claims the priority benefit of China application no. 202111197412.5 filed on Oct. 14, 2021. The entirety of each of the above mentioned patent applications is hereby incorporated by reference herein and made a part of this specification.

BACKGROUND

Technical Field

The present disclosure belongs to the field of oscillators, and relates to a circuit and method for expanding the lock range of injection-locked oscillators.

Description of Related Art

In general, a chip requires a frequency reference used for system clocks, carrier signals, or local oscillators of wireless systems. However, the free-running frequency of an on-chip oscillator varies due to PVT (process, voltage, and temperature) variations, and the clock of the desired frequency cannot be obtained. At present, injection-locked oscillators are widely used to generate frequency signals. An injection-locked oscillator generates an accurate clock signal by following a reference signal with a specific frequency. However, the lock range of the injection locking is small. Only when the free-running frequency of the on-chip oscillator is close to the frequency of the reference signal, the on-chip oscillator can be locked to the reference signal. Generally, the lock range of injection locking is much narrower than the frequency variation caused by PVT, such that when the free-running frequency exceeds the lock range, the oscillator cannot be locked by the reference signal. In this case, the reference signal has a negative effect on the oscillator and reduces the stability of the clock.

SUMMARY

In order to solve the technical problems existing in the prior art, the present disclosure provides a circuit and method for expanding the lock range of injection-locked oscillators, and the specific technical solutions are as follows:

A circuit for expanding the lock range of injection-locked oscillators includes N injection-locked oscillators and a lock detector, where N≥2. The lock detector includes an alignment monitor, a clock selector, and N self-samplers. A pulse reference signal inputs into N injection-locked oscillators, and the output of each injection-locked oscillator is connected to the clock selector and the corresponding self-sampler. The self-samplers use the pulse reference signal to sample the outputs of N injection-locked oscillators, and output sampling results to the alignment monitor. The alignment monitor monitors the sampling results of the self-samplers, determines the locking conditions of the injection-locked oscillators, and turns off unlocked oscillators. The clock selector selects a locked oscillator and turns off unlocked oscillators. After the detection is completed, the lock detector stops working and the clock selector transmits the output of the locked oscillator as the system clock.

Furthermore, the pulse reference signal has a target frequency and provides a reference clock for the injection-locked oscillators.

Furthermore, each injection-locked oscillator includes an oscillator and an injection stage. The pulse reference signal is connected to the oscillators through the injection stages. The free-running frequencies of the oscillators are different, some of them are lower than the frequency of the pulse reference signal, and others are higher than the frequency of the pulse reference signal. When PVT varies, the free-running frequencies of these oscillators are affected at the same time and become higher or lower simultaneously.

Furthermore, the N self-samplers separately sample the outputs of all injection-locked oscillators by using the falling edge of the pulse reference signal. The pulse reference signal shapes the edges of the outputs of the oscillators. When the free-running frequencies are lower than the frequency of the pulse reference signal, the pulse reference signal is self-aligned to the rising edges of the output of the oscillators, and a high voltage is obtained by sampling. When the free-running frequencies are higher than the frequency of the pulse reference signal, the pulse reference signal is self-aligned to the falling edges of the output of the oscillators, and a low voltage is obtained by sampling. If the oscillators are unlocked, the pulse reference signal fails to shape the edges of the outputs of the oscillators, and the sampling results vary between the high voltage and the low voltage.

Furthermore, the alignment monitor monitors the sampling results of the self-samplers and determines whether the injection-locked ring oscillators are locked or not. The alignment monitor is composed of several finite-bit counters. When the highest bit of one of the counters jumps to 1, the corresponding oscillator is determined to be unlocked. In this case, the unlocked oscillator is turned off. When N−1 oscillators are determined to be unlocked, the determination is ended, and the alignment monitor stops working.

Furthermore, the clock selector is composed of a MUX. The output of the alignment monitor is processed and connected to the clock selector, and the clock selector selects one of the outputs of the N injection-locked oscillators as a system clock.

A method for expanding the lock range of injection-locked oscillators includes the following steps:
  step 1, inputting the same pulse reference to N injection-locked oscillators with different free-running frequencies;
  step 2, using the falling edge of the pulse reference to sample the outputs of the N injection-locked oscillators. Based on the self-alignment characteristics of the injection-locked oscillators, the sampling result is a stable voltage when the oscillator is locked, and an unstable voltage when the oscillator is unlocked;
  step 3, monitoring the sampling results by using an alignment monitor, determining whether the oscillators are locked or not according to the sampling results, and then turning off the unlocked oscillators; and
  step 4, selecting a locked oscillator and outputting the locked clock by a clock selector.

Beneficial Effects

In order to expand the lock range of the injection-locked oscillator, N oscillators with different frequencies are used, the locked oscillator is selected by determining the locking conditions of the N oscillators, and the unlocked oscillators are turned off. Such that the lock range of the injection-locked oscillators is expanded while the power consumption is not increased. According to the method, external tuning is not needed. Determination and selection of injection locking are fully automatically achieved, and the lock range can cover the free-running frequency range caused by PVT variation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In order to make the objective, the technical solutions, and the technical effects of the present disclosure more clear, the present disclosure is further described in detail with reference to the accompanying drawings of the specification.

Figure 1:
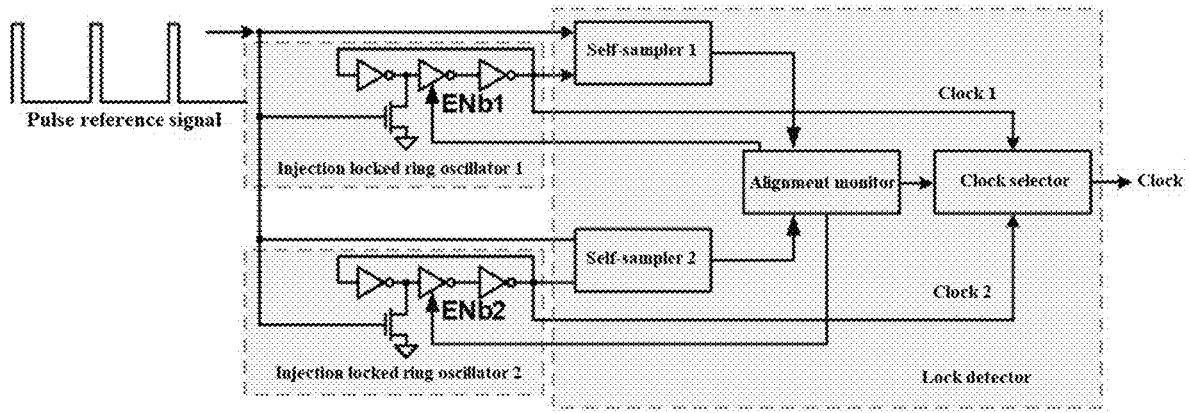
FIG. 1 is a diagram of the present disclosure.

As shown in FIG. 1, a circuit for expanding the lock range of injection-locked oscillators includes N injection-locked oscillators and a lock detector, where N≥2. The lock detector detects output signals of the N injection-locked oscillators in which a pulse reference signal is input and outputs desired clock signals. The lock detector includes an alignment monitor, a clock selector, and N self-samplers.

The pulse reference signal has a target frequency and provides a reference clock for the injection-locked oscillators. The injection-locked oscillators have different free-running frequencies, and clock signals following the pulse reference signal are generated after the pulse reference signal is injected.

Each injection-locked oscillator includes an oscillator and an injection stage. The pulse reference signal is connected to the oscillators through the injection stages. The free-running frequencies of the oscillators are different, some of them are lower than the frequency of the pulse reference signal, and others are higher than the frequency of the pulse reference signal. When PVT varies, the free-running frequencies of these oscillators are affected at the same time and become higher or lower simultaneously.

The pulse reference signal is inputted into the N injection-locked oscillators with different free-running frequencies. The output of each injection-locked oscillator is connected to the clock selector and the corresponding self-sampler. The self-samplers use the pulse reference signal to sample the outputs of the N injection-locked oscillators and outputs sampling results to the alignment monitor. The alignment monitor monitors the sampling results of the self-samplers, determines the locking conditions of the injection-locked oscillators, and turns off unlocked oscillators. The clock selector selects a locked oscillator. After the detection is completed, the lock detector stops working, and the clock selector transmits a clock signal output by the locked oscillator to a system.

Embodiment

Figure 2:
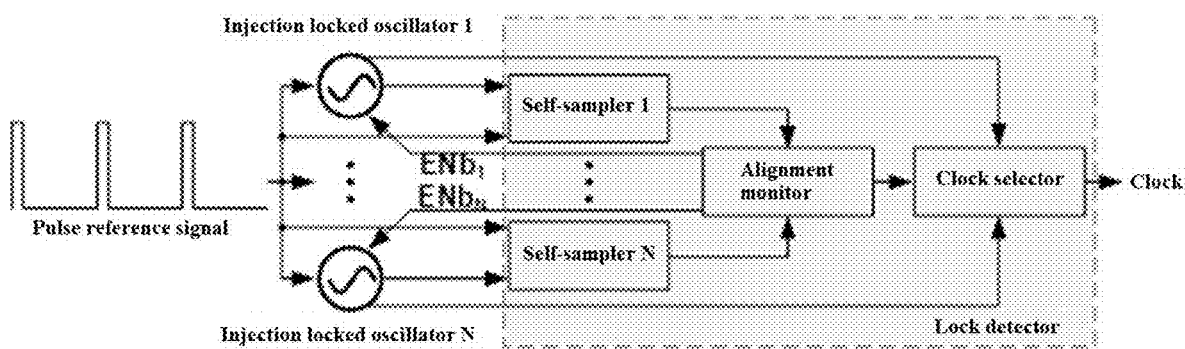
FIG. 2 is a diagram of an embodiment of the present disclosure.

As shown in FIG. 2, the circuit of the present disclosure uses two injection-locked ring oscillators to achieve expansion of the lock range.

Each injection-locked ring oscillator includes three stages of delay units and an N-metal-oxide-semiconductor (NMOS) injection stage. A grid electrode of the NMOS injection stage is connected to a pulse reference signal, a source electrode of the NMOS injection stage is grounded, and a drain electrode of the NMOS injection stage is connected to an oscillator loop. The free-running frequency of injection-locked ring oscillator 1 is lower than the frequency of the pulse reference signal. The free-running frequency of injection-locked ring oscillator 2 is higher than the frequency of the pulse reference signal.

The two self-samplers separately sample the outputs of the two injection-locked ring oscillators by using the falling edge of the pulse reference signal as a lock. Due to the self-alignment of injection locking, when the free-running frequencies are lower than the frequency of the pulse reference signal, if the injection-locked ring oscillators are locked, the pulse reference signal is self-aligned to the rising edges of the outputs of the injection-locked ring oscillators, and a high voltage is obtained by means of sampling. When the free-running frequencies are higher than the frequency of the pulse reference signal, if the injection-locked ring oscillators are locked, the pulse reference signal is self-aligned to the falling edges of the outputs of the injection-locked ring oscillators, and a low voltage is obtained by means of sampling. If the injection-locked ring oscillators are unlocked, the sampling results vary between the high voltage and the low voltage.

The alignment monitor monitors the sampling results of the self-samplers and determines whether the injection-locked ring oscillators are locked or not. The alignment monitor is composed of several finite-bit counters, when the highest bit of one of the counters jumps to 1, the corresponding oscillator is determined to be unlocked. In this case, the unlocked injection-locked ring oscillator is turned off. When the N−1 oscillators are determined to be unlocked, the determination is ended, and the alignment monitor stops working.

The clock selector is composed of a MUX. The output of the alignment monitor is processed and connected to the clock selector, and the clock selector selects one of the outputs of the two injection-locked ring oscillators and inputs the selected output into a subsequent circuit.

In the oscillator circuit, the method for expanding the lock range of injection-locked oscillators in the present disclosure specifically includes: two ring oscillators with different free-running frequencies are used and are locked by a pulse reference signal at the same time, where the free-running frequency of ring oscillator 1 is lower than the frequency of the pulse reference signal, and the frequency of ring oscillator 2 is higher than the frequency of the pulse reference signal. When the circuit is affected by PVT, the free-running frequencies of the two ring oscillators vary in the same direction. If the frequencies of the two ring oscillators become lower, the free-running frequency of ring oscillator 2 is closer to a reference frequency, while the free-running frequency of ring oscillator 1 is far away from the reference frequency, and a lock detector is used to detect whether the two ring oscillators are locked or not. On the basis of self-alignment characteristics of the injection-locked ring oscillators, when the oscillators are locked, the lock detector uses a self-sampler to sample the outputs of the oscillators through the pulse reference signal, and a low voltage or a high voltage is obtained by means of sampling. When the oscillators are unlocked, the sampling results vary between the low voltage and the high voltage. An alignment monitor monitors the sampling results, determines whether the oscillators are locked or not, and then turns off an unlocked oscillator to end detection so as to save power consumption. A clock selector selects a locked oscillator and outputs a clock. According to the method, on the premise of not increasing circuit power consumption, the injection lock range is expanded to cover the frequency range caused by PVT variation, and stable clock generation with low power consumption is achieved.

The above description is only a preferred embodiment of the present disclosure and is not intended to limit the present disclosure in any form. Although the implementation process of the present disclosure is described in detail on the basis of the foregoing, those who are familiar with the art can still make modifications to the technical solutions described in various foregoing examples, or make equivalent replacement to part of its technical features. Any modifications, equivalent replacements, etc. made within the spirit and principles of the present disclosure should fall within the scope of protection of the present disclosure.

What is claimed is:

1. A circuit for expanding the lock range of injection-locked oscillators, comprising: N injection-locked oscillators and a lock detector, wherein N≥2; the lock detector comprises an alignment monitor, a clock selector, and N self-samplers; a pulse reference signal is inputted into the N injection-locked oscillators, and the output of each injection-locked oscillator is connected to the clock selector and the corresponding self-sampler; the self-samplers use the pulse reference signal to sample outputs of the N injection-locked oscillators and outputs sampling results to the alignment monitor; the alignment monitor monitors the sampling results of the self-samplers, determines locking conditions of the injection-locked oscillators and turns off unlocked oscillators among the N injection-locked oscillators; the clock selector selects a locked oscillator among the N injection-locked oscillators and transmits the output of the locked oscillator as a system clock.

2. The circuit for expanding the lock range of injection-locked oscillators according to claim 1, wherein the pulse reference signal has a target frequency and provides a reference clock for the injection-locked oscillators.

3. The circuit for expanding the lock range of injection-locked oscillators according to claim 1, wherein each injection-locked oscillator comprises an oscillator and an injection stage; the pulse reference signal is connected to the N injection-locked oscillators through the injection stages of the N injection-locked oscillators; free-running frequencies of the oscillators are different, some of the free-running frequencies are lower than the frequency of the pulse reference signal, whereas others of the free-running frequencies are higher than the frequency of the pulse reference signal; when PVT (process, voltage, and temperature) varies, the free-running frequencies of the N injection-locked oscillators are affected at the same time and become higher or lower simultaneously.

4. The circuit for expanding the lock range of injection-locked oscillators according to claim 1, wherein the N self-samplers separately sample the outputs of the N injection-locked oscillators by using the falling edge of the pulse reference signal; according to the self-alignment of injection locking, the pulse reference signal shapes edges of the outputs of the N injection-locked oscillators; when free-running frequencies of the N injection-locked oscillators are lower than the frequency of the pulse reference signal, the pulse reference signal is self-aligned to rising edges of the outputs of the N injection-locked oscillators, and a high voltage is obtained by means of sampling; when the free-running frequencies are higher than the frequency of the pulse reference signal, the pulse reference signal is self-aligned to falling edges of the outputs of the N injection-locked oscillators, and a low voltage is obtained by means of sampling; if the N injection-locked oscillators are unlocked, the pulse reference signal cannot shape the edges of the outputs of the N injection-locked oscillators, and the sampling results vary between the high voltage and the low voltage.

5. The circuit for expanding the lock range of injection-locked oscillators according to claim 1, wherein the alignment monitors monitor the sampling results of the self-samplers and determine whether the injection-locked oscillators are locked or not; the alignment monitor is composed of several finite-bit counters, and when the highest bit of one of the finite-bit counters jumps to 1, the corresponding injection-locked oscillator is determined to be unlocked; in this case, the unlocked oscillator is turned off; when N−1 of the injection-locked oscillators are determined to be unlocked, the determining is ended, and the alignment monitor stops working.

6. The circuit for expanding the lock range of injection-locked oscillators according to claim 1, wherein the clock selector is composed of a MUX; the output of the alignment monitor is processed and connected to the clock selector, and the clock selector selects one of the outputs of the N injection-locked oscillators as the system clock.

7. A method for expanding the lock range of injection-locked oscillators, comprising the following steps:
    step 1, inputting a same pulse reference signal to N injection-locked oscillators with different free-running frequencies;
    step 2, using the falling edge of the same pulse reference signal to sample outputs of the N injection-locked oscillators; based on the self-alignment characteristics of the injection-locked oscillators, the sampling result is a stable voltage when the corresponding injection-locked oscillator is locked, and the sampling result is an unstable voltage when the corresponding injection-locked oscillator is unlocked;
    step 3, monitoring the sampling results of the N injection-locked oscillators by using an alignment monitor, determining whether the N injection-locked oscillators are locked or not according to the sampling results, and then turning off the unlocked injection-locked oscillators; and
    step 4, selecting a locked oscillator among the N injection-locked oscillators and outputting a locked clock by a clock selector.

* * * * *